(12) United States Patent
Ooyabu et al.

(10) Patent No.: US 7,154,045 B2
(45) Date of Patent: Dec. 26, 2006

(54) WIRED CIRCUIT BOARD

(75) Inventors: Yasunari Ooyabu, Osaka (JP); Takashi Oda, Osaka (JP); Shinichi Oda, Osaka (JP)

(73) Assignee: Nitto Denko Corporation, Ibaraki (JP)

( * ) Notice: Subject to any disclaimer, the term of this patent is extended or adjusted under 35 U.S.C. 154(b) by 0 days.

(21) Appl. No.: 10/289,178

(22) Filed: Nov. 7, 2002

(65) Prior Publication Data

US 2003/0089520 A1    May 15, 2003

(30) Foreign Application Priority Data

Nov. 13, 2001 (JP) ............................. 2001-347226

(51) Int. Cl.
*H01R 12/04* (2006.01)
*H05K 1/11* (2006.01)

(52) U.S. Cl. ...................................... 174/256; 174/262

(58) Field of Classification Search ................ 174/254, 174/255, 260, 250, 256, 268, 117 F, 257, 174/262; 361/792, 795, 760
See application file for complete search history.

(56) References Cited

U.S. PATENT DOCUMENTS

| | | | | |
|---|---|---|---|---|
| 3,922,579 | A * | 11/1975 | Goto et al. .................. | 313/366 |
| 5,160,374 | A * | 11/1992 | Frederickson et al. ....... | 106/401 |
| 5,800,650 | A * | 9/1998 | Anderson et al. ............ | 156/150 |
| 5,877,478 | A * | 3/1999 | Ando .......................... | 257/777 |
| 5,894,165 | A * | 4/1999 | Ma et al. ..................... | 257/666 |
| 6,004,619 | A * | 12/1999 | Dippon et al. ................ | 29/852 |
| 6,316,734 | B1 * | 11/2001 | Yang ........................... | 174/256 |
| 6,459,043 | B1 * | 10/2002 | Dodsworth ................... | 174/254 |
| 6,472,073 | B1 * | 10/2002 | Singh et al. .................. | 428/432 |
| 6,580,027 | B1 * | 6/2003 | Forrest et al. ............... | 136/263 |
| 2002/0019081 | A1 * | 2/2002 | Denis et al. .................. | 438/149 |
| 2002/0025441 | A1 * | 2/2002 | Hieda et al. .................. | 428/440 |
| 2002/0051423 | A1 * | 5/2002 | Hayashida et al. .......... | 369/286 |
| 2003/0193090 | A1 * | 10/2003 | Otani et al. .................. | 257/758 |

FOREIGN PATENT DOCUMENTS

| | | |
|---|---|---|
| JP | 60-231396 A | 11/1985 |
| JP | 63-90898 | 6/1988 |
| JP | 01-262485 | 10/1989 |
| JP | 02-174289 | 7/1990 |
| JP | 05-230249 | 9/1993 |
| JP | 05-259591 | 10/1993 |
| JP | 08-153940 | 6/1996 |
| JP | 08-175815 | 7/1996 |
| JP | 08-277116 | 10/1996 |
| JP | 10-044286 A | 2/1998 |
| JP | 2000-183586 A | 6/2000 |
| JP | 2001-119193 A | 4/2001 |

* cited by examiner

*Primary Examiner*—Ishwar I. B. Patel
(74) *Attorney, Agent, or Firm*—Jean C. Edwards, Esq.; Akerman Senterfitt

(57) ABSTRACT

A wired circuit board having a semi-conducting layer which has excellent chemical resistance, such as acid resistance and alkali resistance, provides no possibility of minute particles being mixed into parts mounted on the wired circuit board; and yet has excellent surface resistivity against electrostatic damage. In the wired circuit board having a conductive layer formed on one side of a base insulating layer in the form of a predetermined wired circuit pattern and a cover insulating layer formed on the conductive layer, a base-side semi-conducting layer and a cover-side semi-conducting layer, which include metal oxide, metal nitride or metal carbide, are formed on the other side of the base insulating layer and the cover insulating layer, respectively, by physical vapor deposition (PVD) or preferably by sputtering.

6 Claims, 5 Drawing Sheets

WIRED CIRCUIT BOARD

BACKGROUND OF THE INVENTION

1. Field of the Invention

The present invention claims priority from Japanese Patent Application Serial No. 2001-347226, filed Nov. 13, 2001, which is herein incorporated by reference.

The present invention relates to a wired circuit board and, more particularly, to a wired circuit board used for electric/electronic equipment.

2. Description of the Prior Art

A wired circuit board, such as a flexible wired circuit board, widely used for a variety of electric/electronic equipment, is formed, for example, by laminating an insulating layer of polyimide resin and the like on either side or both sides of a conductive layer of a copper foil and the like.

When parts are mounted on this wired circuit board, the parts are sometimes damaged by static electricity in the mounting process. For solving this problem, several methods have been proposed wherein a semi-conducting layer is formed on the insulating layer so that the charged electric charge can be immediately attenuated to a smaller potential value than a potential at which the electrostatic damage of the parts may be caused. More specifically, the proposed methods include, for example, the method of forming on the insulating layer a semi-conducting layer of semi-conducting polymer, such as polyaniline and polypyrrole; the method of forming on the insulating layer a semi-conducting layer of material packed with conductive minute particles such as carbon black; and the method of forming on the insulating layer the semi-conducting layer of metal.

However, those methods have the following disadvantages. First, the method using the semi-conducting layer of the semi-conducting polymer such as polyaniline and polypyrrole has the following disadvantage. When the semi-conducting layer of the semi-conducting polymer contacts acid or alkali in the process of the manufacture of the wired circuit board, its conductive characteristics are deprived. Due to this, the semi-conducting layer must be plated or subjected to organic rust proofing before it is formed on the insulating layer, then causing change in characteristics of the plated surface or in organic rust proofing.

Second, the method using a semi-conducting layer of material packed with conductive minute particles such as carbon black has the disadvantage that the semi-conducting layer of material packed with conductive minute particles is not adequate for precision instruments such as hard disc drive. This is because there is the possibility that the conductive minute particles of the semi-conducting layer may be mixed into the precision instruments to cause malfunction or damage of the precision instruments.

Finally, the method using the semi-conducting layer of metal has the following disadvantage. Although the semi-conducting layer of metal can provide significantly reduced surface resistivity (also can be cited as 'sheet resistance') and thus may provide the electrostatic protection measure, since the surface resistivity is reduced so significantly, possible malfunction of the mounted parts may be caused by such a semi-conducting layer.

SUMMARY OF THE INVENTION

It is the object of the invention to provide a wired circuit board having a semi-conducting layer which has excellent chemical resistance, such as acid resistance and alkali resistance; provides no possibility of minute particles being mixed into parts mounted on the wired circuit board; and yet has excellent surface resistivity against electrostatic damage.

The present invention is directed to a novel wired circuit board comprising an insulating layer and a conductive layer, wherein a semi-conducting layer of at least one material selected from the group consisting of metal oxide, metal nitride and metal carbide is formed on the insulating layer.

In the present invention, it is preferable that surface resistivity of the semi-conducting layer is in the range of $10^4$–$10^{10} \Omega/\square$.

In the present invention, the semi-conducting layer is formed by a physical vapor deposition method.

In the wired circuit board of the present invention, a semi-conducting layer of at least one material selected from the group consisting of metal oxide, metal nitride and metal carbide is formed on the insulating layer. This can produce the result that when parts are mounted on this wired circuit board, the charged electric charge can be immediately attenuated to a smaller potential value than a potential at which the electrostatic damage of the parts may be caused. Hence, the parts mounted on the wired circuit board can effectively be prevented from being damaged by static electricity. Besides, since the semi-conducting layer comprises metal oxide, metal nitride, or metal carbide, the layer has excellent acid/alkali resistance, such that when the semi-conducting layer contacts acid or alkali in the process of the manufacture of the wired circuit board, its conductive characteristics are not deprived. Further, there is no possibility of conductive minute particles, such as carbon black, being mixed into other equipment. Hence, the wired circuit board of the embodiment of the present invention can be adequately used for precision instruments such as hard disc drive.

Figure 2:
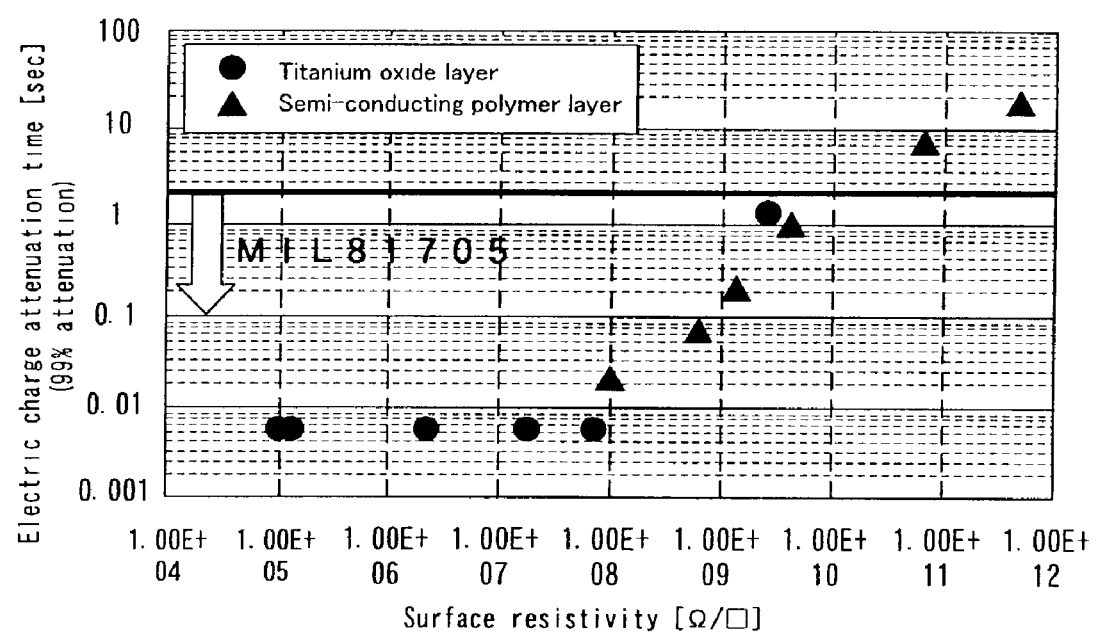
Figure 3:
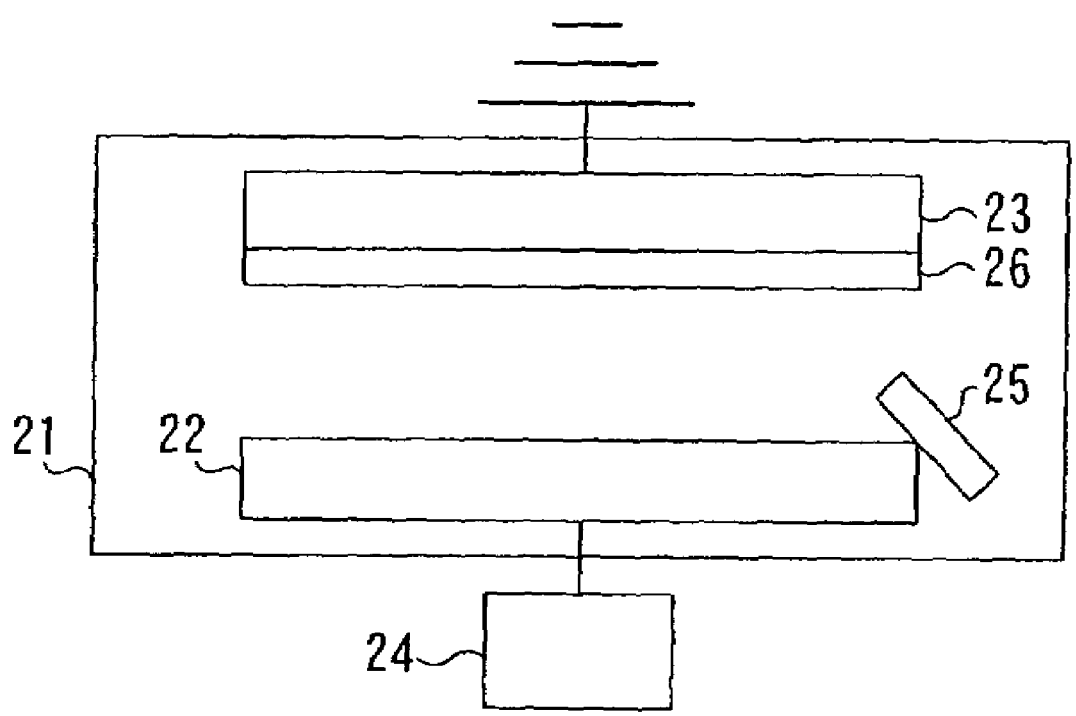
Figure 4:
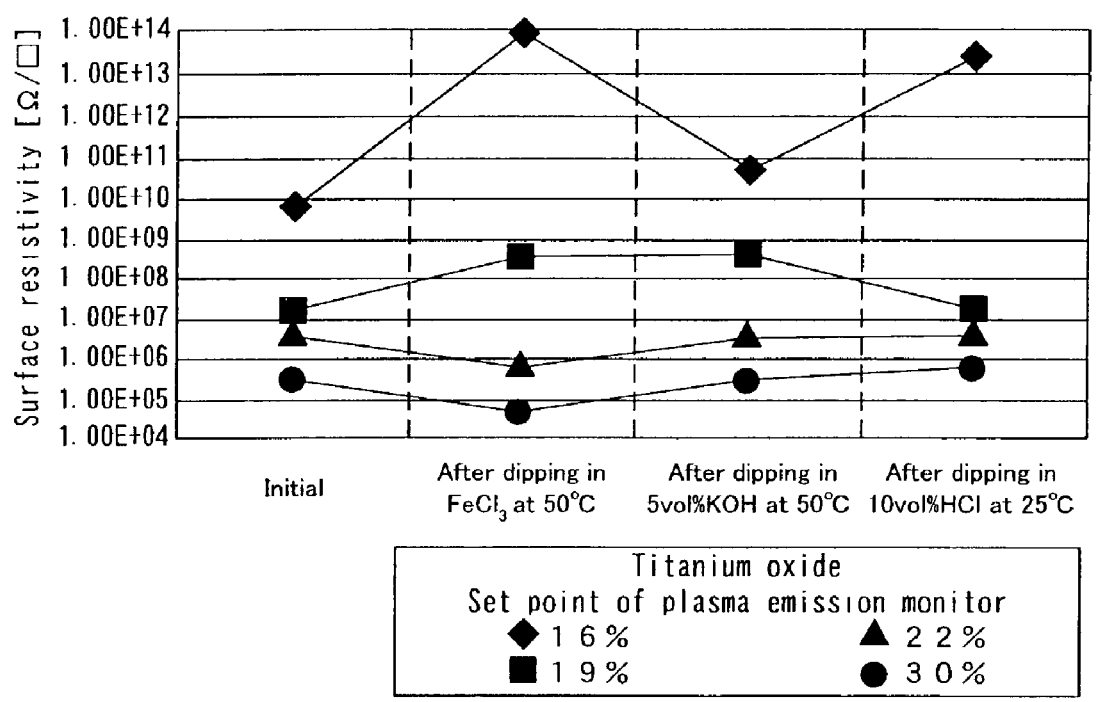
Figure 5:
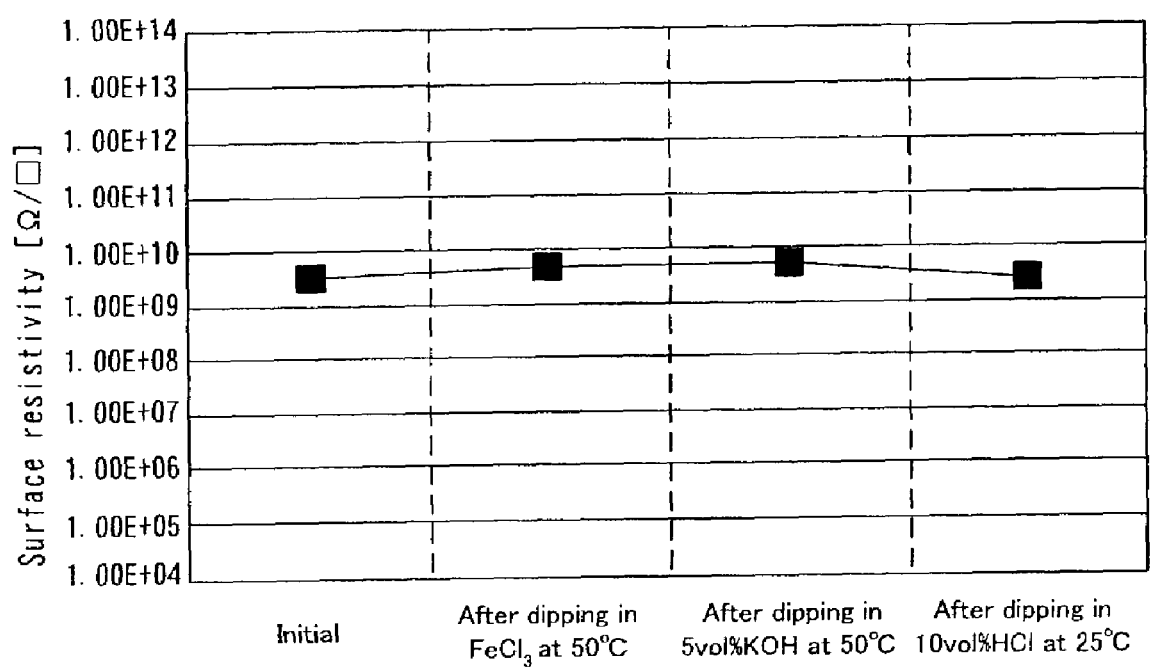

(a) shows the step of preparing a two-layer substrate comprising a base insulating layer and a conductive layer laminated on one side of the base insulating layer;

(b) shows the step of forming a base-side semi-conducting layer on the other side of the base insulating layer;

(c) shows the step of forming the conductive layer into a predetermined wired circuit pattern;

(d) shows the step of forming a cover insulating layer on the conductive layer;

(e) shows the step of forming a cover-side semi-conducting layer on the cover insulating layer;

(f) shows the step of forming a base-side through hole and a cover-side through hole; and (g) shows the step of forming a base-side connecting terminal and a cover-side connecting terminal, FIG. 2 is a correlation diagram showing the relation between the surface resistivity and the electric charge attenuation time, FIG. 3 schematically shows the structure of a spattering device, FIG. 4 is a diagram showing changes in surface resistivity of the semi-conducting layers obtained in Example 1 after dipped in iron (II) chloride solution, sodium hydroxide solution and hydrochloric acid, and FIG. 5 is a diagram showing changes in surface resistivity of the semi-conducting layers obtained in Example 3 after dipped in iron (II) chloride solution, sodium hydroxide solution and hydrochloric acid.

DETAILED DESCRIPTION OF THE PREFERRED EMBODIMENTS

Figure 1:
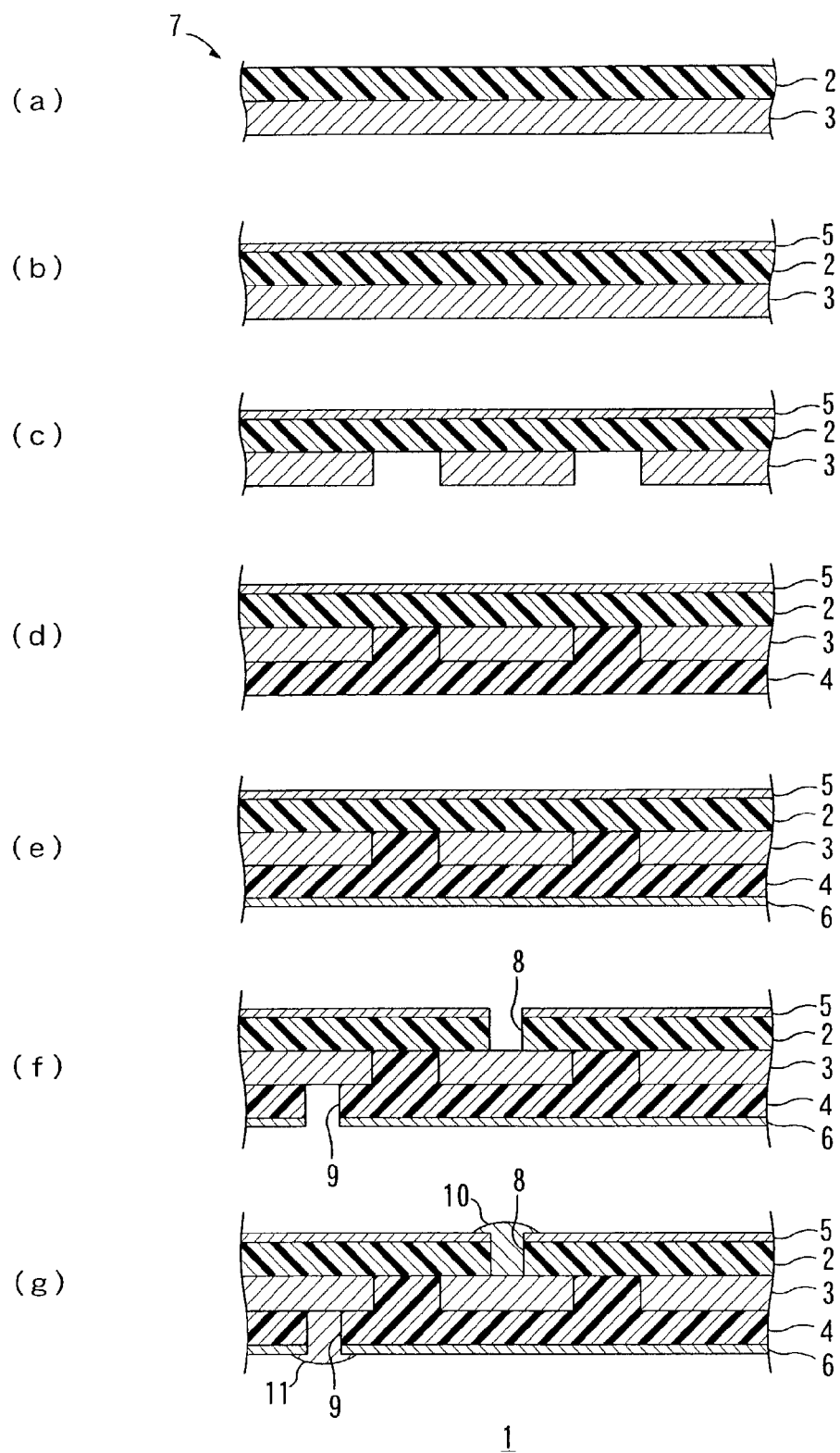
FIG. 1 shows in section the production processes of an embodiment of a wired circuit board of the present invention.

Referring to FIG. 1, there are shown in section the production processes of a wired circuit board of an embodiment of the present invention. The wired circuit board 1 comprises a base insulating layer 2, a conductive layer 3 formed on one side of the base insulating layer 2 in the form of a predetermined wired circuit pattern, a cover insulating layer 4 formed on the conductive layer 3, a base-side semi-conducting layer 5 formed on the other side of the base insulating layer 2 and a cover-side semi-conducting layer 6 formed on the cover insulating layer 4, as shown in FIG. 1(g).

The base insulating layer 2 and the cover insulating layer 4 may be formed of adequate material without any particular limitation, as long as it has electrical insulation property and adequate flexibility. For example, thermosetting resin or thermoplastic resin, such as polyester resin, epoxy resin, urethane resin, polystyrene resin, polyethylene resin, polyamide resin, polyimide resin, acrylonitrile-butadiene-styrene (ABS) copolymer resin, polycarbonate resin, silicone resin and fluorocarbon resin can be used as the material of the base insulating layer and the cover insulating layer. Of these resins, polyimide resins are preferably used in the field of electronic industry material, in terms of heat resistance and mechanical strength. Of those resins, photosensitive resins are preferably used. Among others, photosensitive polyimide resins are further preferably used. The use of the photosensitive resins can provide the advantage that the forming and patterning of the insulating layer can be performed simultaneously by exposing the photosensitive resin layer to light and also developing it in the manufacture of the wired circuit board 1.

Usually, the thickness of the base insulating layer 2 and the cover insulating layer 4 is set to be in the range of 5–500 µm, or preferably 5–150 µm, in terms of mechanical strength and flexibility, though no particular limitation is imposed on the thickness of the same.

Also, no particular limitation is imposed on the material of the conductive layer 3, as long as it has electric conductive properties. For example, simple metal substance, such as gold, silver, copper, platinum, lead, tin, nickel, cobalt, indium, rhodium, chromium, tungsten and ruthenium, or a variety of alloys thereof, such as solder, nickel-tin and gold-cobalt. Among them, copper is preferably used, in terms of easiness in forming the wired circuit board and electric properties. Usually, the thickness of the conductive layer 3 is set to be in the range of 1–50 µm, or preferably 1–20 µm, in terms of easiness in forming the wired circuit board, though no particular limitation is imposed on the thickness of the same. The conductive layer 3 is formed in the form of a predetermined wired circuit pattern, as mentioned later.

The materials that may be used to form the base-side semi-conducting layer 5 and the cover-side semi-conducting layer 6 include, for example, simple substances of metal oxide, metal nitride or metal carbide, such as aluminum, titanium, tantalum, chromium, tin, zinc, zirconium, silicon, gallium and indium, or metal oxide, metal nitride or metal carbide and their alloys. Of these materials, aluminum, titanium and chromium can be cited as the preferable ones.

Preferably, the base-side semi-conducting layer 5 and the cover-side semi-conducting layer 6 have surface resistivity of $10^4$–$10^{10}\Omega/\square$, or more preferably $10^4$–$10^9\Omega/\square$. The surface resistivity in this range can meet the MIL81705 standard (for evaluating the static electricity measurement effect that the time for the charged electric charge to be diffused 99% after the application of ±5 kV is equal to or less than 2 seconds)

While the units of the surface resistivity are commonly expressed as ($\Omega/\square$), it can be simply expressed as ($\Omega$).

Shown in FIG. 2 is the relation between the surface resistivity and the electric charge attenuation time on the titanium oxide layer and the semi-conducting polymer layer which are formed as the semi-conducting layer. It is seen from FIG. 2 that there is a correlation between the surface resistivity and the electric charge attenuation time, such that the surface resistivity in the range of $10^4$–$10^{10}\Omega/\square$ can meet the MIL81705 standard. It is to be noted that the surface resistivity shown herein is a measurement value obtained when the time for the charged electric charge to be diffused 99% after the application of ±5 kV is measured with Static Decay Meter-406D (available from Electro-Tech System Co., Ltd.) in the same manner as in Examples mentioned later.

The thickness of the base-side semi-conducting layer 5 and that of the cover-side semi-conducting layer 6 depend on the kinds of metal oxide, metal nitride or metal carbide, or on the degree of oxidation, nitridation and carbonization. Preferably, the thickness of the base-side semi-conducting layer 5 and that of the cover-side semi-conducting layer 6 are set so that the surface resistivity can be in the range of $10^4$–$10^{10}\Omega/\square$ as mentioned above. In terms of ease with which inspection can be made in the inspection process of the post process, it is preferable that the thickness is so set as to obtain the transmittance of the visible light of 50% or more. Specifically, it is preferable that the thickness of the base-side semi-conducting layer 5 and the cover-side semi-conducting layer 6 is so set as to be within the range of 5–1,000 nm, or preferably 10–500 nm.

The wired circuit board 1 includes a base-side through hole 8 formed to extend through the base-side semi-conducting layer 5 and the base insulating layer 2; a base-side connecting terminal 10 formed in the base-side through hole 8; a cover-side through hole 9 formed to extend through the cover-side semi-conducting layer 6 and the cover insulating layer 4; and a cover-side connecting terminal 11 formed in the cover-side through hole 9.

This wired circuit board 1 is produced in the following manner. First, a two-layer substrate 7 comprising the base insulating layer 2 and the conductive layer 3 laminated on one side of the base insulating layer 2 is prepared, as shown in FIG. 1(a). The two-layer substrate 7 can be produced, for example, in the manner that after resin solution is applied to a surface of the conductive layer 3 of a metal foil, it is dried and cured to form the base insulating layer 2 of a resin of a film-like form. Alternatively, the two-layer substrate 7 may be produced, for example, in the manner that the base insulating layer 2 of the resin previously formed in a film-like form is adhesive bonded to the conductive layer 3 of the metal foil via an adhesive layer, if necessary.

Then, in this method, the base-side semi-conducting layer 5 is formed on the other side of the base insulating layer 2, as shown in FIG. 1(b). The base-side semi-conducting layer 5 is preferably formed by the physical vapor deposition (PVD) method, though it may be formed in an adequate method without any particular limitation. The physical vapor deposition (PVD) method enables the base-side semi-conducting layer 5 to be formed into a uniformly extended thin film with ease and reliability. The physical vapor deposition (PVD) methods that may be used include, for example, known physical vapor depositions, such as sputtering, vacuum deposition and ion plating process. The sputtering is preferably used, in terms of ease with which oxidation, nitridation and carbonization can be controlled and difficulty with which impurities are mixed into the semi-conducting layer.

In the sputtering, for example the sputtering device shown in FIG. 3 is used. The sputtering device shown in FIG. 3 includes a target 22 (a metal used for forming oxide, nitride or carbide) and an earth electrode 23 which are placed opposite to each other at a given space in a vacuum chamber 21. A power source 24 is connected with the target 22, and a plasma emission monitor 25 is disposed to emit plasma to the target 22. The earth electrode 23 is grounded and has a substrate 26 in place thereon. (It is to be noted here that the base insulating layer 2 of the two-layer substrate 7 is put in place to be opposite to the target 22.)

Then, reactive gas, such as oxygen (for forming oxide), nitrogen (for forming nitride) or acetylene (for forming carbide), and inert gas, such as argon and carbon dioxide, are introduced into the vacuum chamber 21. The temperature of the earth electrode 23 is set to be in the range of 0–200° C., or preferably 50–150° C. and also the degree of vacuum is set to be in the range of 0.01–1 Pa, or preferably 0.1–1 Pa, in terms of superiority in sticking efficiency of the target 22. Then, an electric power (0.5–10 W/cm$^2$, or preferably 3–6 W/cm$^2$) is applied to the target 22 from the power source 24, so that while the plasma emission intensity is maintained at a constant value by the plasma emission monitor 25, the target 22 is sputtered, to form the base-side semi-conducting layer 5 on the surface of the base insulating layer 2.

In the sputtering, it is necessary to control various factors, such as degree of vacuum, purity of the target 22, power to be applied from the power source 24, film thickness, mixed rate and amount of gas introduced, and plasma emission intensity. In order for the surface resistivity of the base-side semi-conducting layer 5 to be in the range of $10^4$–$10^{10}\Omega/\square$ as mentioned above, it is particularly important to control the film thickness and the plasma emission intensity. The plasma emission intensity has, for example, the specific emission spectrum (conformation spectrum) to be distinguished according to the kinds of metals used for the target 22, as shown in TABLE 1. A film having high reproducibility can be produced by regulating an amount of gas introduced in such a manner that the plasma emission intensity can be maintained at a constant value.

TABLE 1

| Metal | Conformation spectrum (nm) |
|---|---|
| Al | 396.1 |
| Ti | 453.4 |
| Ta | 481.2 |
| Cr | 425.4 |
| Sn | 326.2 |
| Zn | 330.2 |
| Zr | 361 |
| Si | 251.6 |

The plasma emission intensity is controlled by a set point of the plasma emission monitor 25. This control is made in the following manner. The plasma emission intensity prior to the gas introduction is taken as 90% and the relative value is set as the set point. In this setting, it is preferable that the set point of the plasma emission monitor 25 is set by using the target 22 so that the surface resistivity of the base-side semi-conducting layer 5 can be in the range of $10^4$–$10^{10}\Omega/\square$, as mentioned above. For example, when the base-side semi-conducting layer 5 of titanium oxide is formed, the set point of the plasma emission monitor 25 is set in the range of 14–32%, with titanium as the target 22 and oxygen as the gas introduced. For example, when the base-side semi-conducting layer 5 of titanium nitride is formed, the set point of the plasma emission monitor 25 is set in the range of 20–34%, with titanium as the target 22 and nitrogen as the gas introduced.

In this sputtering, an adequate sputtering method is selected from known sputtering methods, such as DC sputtering, RF sputtering, magnetron sputtering, or combination thereof.

In the vacuum deposition, for example, the material deposited (metal oxide, metal nitride or metal carbide) and the substrate (the two-layer substrate 7) are placed opposite to each other at a given space in the vacuum chamber. The material deposited is deposited on the surface of the base insulating layer 2 in vacuum in a heating method, such as resistive heating, crucible external heating, electron-beam heating, high-frequency heating or laser heating, to form the base-side semi-conducting layer 5. It is preferable that the deposition conditions including the degree of vacuum are adequately set so that the surface resistivity of the base-side semi-conducting layer 5 can be in the range of $10^4$–$10^{10}\Omega/\square$, as mentioned above.

In the ion plating, for example, the material deposited (metal or its oxide, nitride and carbide) and the substrate (the two-layer substrate 7) are placed opposite to each other at a given space in the vacuum chamber. The reactive gas, such as oxygen (for forming oxide), nitrogen (for forming nitride) or acetylene (for forming carbide) is introduced into the vacuum chamber. The plasma discharge is generated in a vacuum in an electric discharge method, such as DC discharge excitation method, high-frequency discharge excitation method, hollow cathode discharge method or are discharge method, and also the material deposited is allowed to react with the reactive gas, to form the base-side semi-conducting layer 5 on the surface of the base insulating layer 2. It is preferable that the ion plating conditions including the degree of vacuum are adequately set so that the surface resistivity of the base-side semi-conducting layer 5 can be in the range of $10^4$–$10^{10}\Omega/\square$, as mentioned above.

Subsequently, in this process, the conductive layer 3 is patterned into a predetermined wired circuit pattern, as shown in FIG. 1(c). The patterning of the conductive layer 3 is performed in a known patterning process, such as a subtractive process. In the subtractive process, for example, an etching resist is formed on the conductive layer 3 to correspond to the predetermined wired circuit pattern, first, and, then, the conductive layer 3 is etched, with that etching resist as the resist, and, thereafter, the etching resist is removed from the conductive layer 3.

Alternatively, the patterning of the conductive layer 3 may be made in an additive process or a semi-additive process, for example. In this process, since the conductive layer 3 is formed on one side of the base insulating layer 2 in the form of the predetermined wired circuit pattern, the base-side semi-conducting layer 5 may be formed on the other side of the base insulating layer 2 at a later stage.

Subsequently, in this process, the cover insulating layer 4 is formed on the conductive layer 3, as shown in FIG. 1(d). The cover insulating layer 4 may be formed in the manner that after resin solution is applied to the surface of the conductive layer 3, it is dried and cured, or in the manner that the cover insulating layer 4 of the resin previously formed in a film-like form is adhesive bonded to the conductive layer 3 via the adhesive layer, if necessary, as is the case with the formation of the base insulating layer 2.

Then, the cover-side semi-conducting layer 6 is formed on the cover insulating layer 4, as shown in FIG. 1(e). The cover-side semi-conducting layer 6 may be formed in the physical vapor deposition (PVD) process, or preferably the sputtering, as is the case with the formation of the base-side semi-conducting layer 5.

Thereafter, the base-side through hole 8 extending through the base-side semi-conducting layer 5 and the base insulating layer 2 is formed therein so that one side of the conductive layer 3 can be exposed, and the cover-side through hole 9 extending through the cover-side semi-conducting layer 6 and the cover insulating layer 4 is formed therein so that the other side of the conductive layer 3 can be exposed, as shown in FIG. 1(f). The base-side through hole 8 and the cover-side through hole 9 may be formed in a known method, such as laser machining, drilling, punching or etching.

Finally, the base-side connecting terminal 10 and the cover-side connecting terminal 11 are formed in the base-side through hole 8 and the cover-side through hole 9, respectively, to thereby produce the wired circuit board 1, as shown in FIG. 1(g). The base-side connecting terminal 10 and the cover-side connecting terminal 11 may be in the form of a bump comprising gold, silver, copper or solder by either of electrolysis plating or electroless plating, for example.

The wired circuit board 1 thus produced has the construction that the base-side semi-conducting layer 5 and the cover-side semi-conducting layer 6, each having excellent surface resistivity against the electrostatic damage, are formed on the base insulating layer 2 and the cover insulating layer 4, respectively. This construction can produce the result that when parts are mounted on this wired circuit board 1, the charged electric charge can be immediately attenuated to a smaller potential value than a potential at which the electrostatic damage of the parts may be caused. Hence, the parts mounted on the wired circuit board can effectively be prevented from being damaged by static electricity.

Besides, since the base-side semi-conducting layer 5 and the cover-side semi-conducting layer 6 comprise metal oxide, metal nitride, or metal carbide, those layers 5, 6 have excellent acid/alkali resistance, such that when they contact acid or alkali in the process of the manufacture of the wired circuit board 1, their conductive characteristics are not deprived. Further, there is no possibility of the conductive minute particles, such as carbon black, being mixed into other equipment. Hence, the wired circuit board 1 can be adequately used for precision instruments such as hard disc drive.

Although in the method mentioned above, the base-side semi-conducting layer 5 is formed on the base insulating layer 2 in the process of FIG. 1(b) and the cover-side semi-conducting layer 6 is formed on the cover insulating layer 4 in the process of FIG. 1(e), the base-side semi-conducting layer 5 and the cover-side semi-conducting layer 6 may be formed in any earlier process than the process of FIG. 1(f) wherein the base-side through hole 8 and the cover-side through hole 9 are formed.

The wired circuit board of the present invention is not limited to the one of the above-noted embodiment wherein the base insulating layer 2, the conductive layer 3 and the cover insulating layer 4 are laminated and the base-side semi-conducting layer 5 and the cover-side semi-conducting layer 6 are laminated on the base insulating layer 2 and the cover insulating layer 4, respectively. Modification may be made in the present invention such as, for example, the base insulating layer 2 and the conductive layer 3 being laminated and only the base-side semi-conducting layer 5 being simply laminated on the surface of the base insulating layer 2. Alternatively, another modification may be made such that the base-side semi-conducting layer 5 and/or the cover-side semi-conducting layer 6 are/is laminated on the base insulating layer 2 and/or the cover insulating layer 4 in a multi-layer wired circuit board having the conductive layer 3 of two or more layers.

EXAMPLES

While in the following, the present invention will be described in further detail with reference to Examples, the present invention is not limited to any of Examples.

Example 1

In the substrate formed by laminating the insulating layer of polyimide resin having thickness of 25 μm and the conductive layer of the copper foil having thickness of 18 μm, a film of titanium oxide was formed on the polyimide resin as the semi-conducting layer by the DC magnetron sputtering.

The semi-conducting layers were formed with the sputtering device shown in FIG. 3 under the conditions that oxygen (gas introduced) was introduced into the vacuum chamber; the temperature of the earth electrode was set at 100° C.; the degree of vacuum was set at 0.3 Pa; the electric power of 4 W/cm$^2$ was applied to the target from the power source; and that the plasma emission monitor was set at 16%, 19%, 22% and 30%.

The surface resistivity of the semi-conducting layers obtained and the time for the charged electric charge to be diffused 99% after the application of ±5 kV were measured with Static Decay Meter-406D (available from Electro-Tech System Co., Ltd: Measurement limit: 0.005 sec.). The measurement results are shown in TABLE 2.

TABLE 2

| Set point of plasma emission monitor | Surface resistivity [Ω/□] | Electric charge attenuation time [sec.] |
|---|---|---|
| 16 | 2.60E + 09 | 1.21 |
| 19 | 1.76E + 07 | 0.0053 |
| 22 | 2.27E + 06 | 0.0053 |
| 30 | 1.30E + 05 | 0.0053 |

It is seen from TABLE 2 that the surface resistivity of the semi-conducting layers can be controlled arbitrarily by changing the setting of the set point of the plasma emission monitor. It is also seen therefrom that the surface resistivity which is in the range specified above can meet the MIL81705 standard that the time for the charged electric charge to be diffused 99% after the application of ±5 kV is equal to or less than 2 seconds.

Also, changes in surface resistivity of the semi-conducting layers obtained in this Example after dipped in iron (II) chloride solution, sodium hydroxide solution and hydrochloric acid used in the wired circuit board forming process were measured. The measurement results are shown in FIG. 4. It is seen from FIG. 4 that even when dipped in the acid and alkali solution, all the semi-conducting layers, except the semi-conducting layer produced with the set point of the plasma emission monitor set at 16%, do not deprive their conductive characteristics, differently from the semi-conducting layer of semi-conducting polymer. It is found therefrom that the semi-conducting layers of this Example have excellent chemical resistance.

Example 2

In the substrate formed by laminating the insulating layer of polyimide resin having thickness of 25 μm and the conductive layer of the copper foil having thickness of 18 μm, a film of titanium nitride was formed on the polyimide resin as the semi-conducting layer by the DC magnetron sputtering.

The semi-conducting layers were formed with the sputtering device shown in FIG. 3 under the conditions that nitrogen (gas introduced) was introduced into the vacuum chamber; the temperature of the earth electrode was set at 100° C.; the degree of vacuum was set at 0.6 Pa; the electric power of 3 W/cm$^2$ was applied to the target from the power source; and that the plasma emission monitor was set at 18%, 21% and 24%.

The surface resistivity of the semi-conducting layers obtained and the time for the charged electric charge to be diffused 99% after the application of ±5 kV were measured with Static Decay Meter-406D (available from Electro-Tech System Co., Ltd: Measurement limit: 0.005 sec.). The measurement results are shown in TABLE 3.

TABLE 3

| Set point of plasma emission monitor | Surface resistivity [Ω/□] | Electric charge attenuation time [sec.] |
| --- | --- | --- |
| 18 | 2.29E + 11 | 10.71 |
| 21 | 8.84E + 04 | 0.0053 |
| 24 | 2.37E + 04 | 0.0053 |

It is seen from TABLE 3 that the surface resistivity of the semi-conducting layers can be controlled arbitrarily by changing the setting of the set point of the plasma emission monitor. It is also seen therefrom that the semi-conducting layers produced with the set point of the plasma emission monitor set at 21% and 24% can meet the MIL81705 standard that the time for the charged electric charge to be diffused 99% after the application of ±5 kV is equal to or less than 2 seconds.

Example 3

In the substrate formed by laminating the insulating layer of polyimide resin having thickness of 25 μm and the conductive layer of the copper foil having thickness of 18 μm, a film of Ga—In—SnO$_2$ was formed on the polyimide resin as the semi-conducting layer by the RF sputtering.

The semi-conducting layers were formed with the sputtering device shown in FIG. 3 under the conditions that the earth electrode was not heated; the degree of vacuum was set at 0.4 Pa; the electric power of 3 W/cm$^2$ was applied to the target from the power source; and that two different mixed gasses of argon and carbon dioxide mixed in a different mixing ratio (Ar/CO$_2$=50/0, Ar/CO$_2$=20/30) were introduced in the vacuum chamber of the sputtering device.

The surface resistivity of the semi-conducting layers obtained and the time for the charged electric charge to be diffused 99% after the application of ±5 kV were measured with Static Decay Meter-406D (available from Electro-Tech System Co., Ltd: Measurement limit: 0.005 sec.). The measurement results are shown in TABLE 4.

TABLE 4

| Mixing ratio of mixed gas | Surface resistivity [Ω/□] | Electric charge attenuation time [sec.] |
| --- | --- | --- |
| Ar/CO$_2$ = 50/0 | 2.70E + 09 | 1.23 |
| Ar/CO$_2$ = 20/30 | 1.15E + 06 | 0.0053 |

It is seen from TABLE 4 that the surface resistivity of the semi-conducting layers can be controlled arbitrarily by changing the mixing ratio of the mixed gas. It is also seen therefrom that the surface resistivity which is in the range specified above can meet the MIL81705 standard that the time for the charged electric charge to be diffused 99% after the application of ±5 kV is equal to or less than 2 seconds.

Also, changes in surface resistivity of the semi-conducting layers obtained (only the semi-conducting layers formed with the mixed gas mixed in the ratio of Ar/CO$_2$=50/0) after dipped in iron (II) chloride solution, sodium hydroxide solution and hydrochloric acid used in the wired circuit board forming process were measured. The measurement results are shown in FIG. 5. It is seen from FIG. 5 that even when dipped in the acid and alkali solution, the semi-conducting layers do not deprive their conductive characteristics, differently from the semi-conducting layer of semi-conducting polymer. It is found therefrom that the semi-conducting layers of this Example have excellent chemical resistance.

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board comprising:
    a conductive layer made of a copper foil having a thickness in a range of 1 to 50 μm;
    a first insulating layer formed on one surface of said conductive layer and made of a polyimide resin having a thickness of 5–150 μm;
    a second insulating layer formed on another surface of said conductive layer and made of the polyimide resin having a thickness of 5–150 μm;
    at least one of a first semi-conducting layer formed on the first insulating layer and made of Ga—In—SnO$_2$ having a thickness of 5–1,000 nm; and a second semi-conducting layer formed on the second insulating layer and made of Ga—In—SnO$_2$, having a thickness of 5–1,000 nm;
    a first through hole formed to extend through said first semi-conducting layer and said first insulating layer to said conductive layer; and
    a first terminal formed in said first through hole.

2. The wired circuit board according to claim 1, wherein surface resistivity of the semi-conducting layer is in the range of $10^4$–$10^{10}$ Ω/□.

3. The wired circuit board according to claim 1, wherein the semi-conducting layer is formed by a physical vapor deposition method.

4. The wired circuit board according to claim 1, wherein a thickness of at least one of said first semi-conducting layer and said second semi-conducting layer is in a range of 5 to 100 nm.

5. The wired circuit board according to claim 1, further comprising:
a second through hole formed to extend through said second semi-conducting layer and said second insulating layer to said conductive layer.

6. The wired circuit board according to claim 5, further comprising:
a second terminal formed in said second through hole.

* * * * *